United States Patent
Ide

(10) Patent No.: US 9,240,671 B2
(45) Date of Patent: Jan. 19, 2016

(54) LASER LIGHT SOURCE

(71) Applicant: CITIZEN HOLDINGS CO., LTD., Nishitokyo-shi, Tokyo (JP)

(72) Inventor: Masafumi Ide, Tokorozawa (JP)

(73) Assignee: CITIZEN HOLDINGS CO., LTD., Tokyo (JP)

( * ) Notice: Subject to any disclaimer, the term of this patent is extended or adjusted under 35 U.S.C. 154(b) by 0 days.

(21) Appl. No.: 14/351,265

(22) PCT Filed: Oct. 29, 2012

(86) PCT No.: PCT/JP2012/077926
§ 371 (c)(1),
(2) Date: Apr. 11, 2014

(87) PCT Pub. No.: WO2013/069497
PCT Pub. Date: May 16, 2013

(65) Prior Publication Data
US 2014/0293402 A1    Oct. 2, 2014

(30) Foreign Application Priority Data
Nov. 7, 2011    (JP) .................. 2011-243958

(51) Int. Cl.
*G02B 6/125* (2006.01)
*H01S 5/00* (2006.01)
(Continued)

(52) U.S. Cl.
CPC .............. *H01S 5/0078* (2013.01); *G02B 6/125* (2013.01); *H01S 5/0071* (2013.01); *H01S 5/02248* (2013.01); *H01S 5/4012* (2013.01);
(Continued)

(58) Field of Classification Search
CPC ...... G02B 6/125; G02F 1/377; H01S 5/02248; H01S 5/0092; H01S 5/4093; H01S 5/0071; H01S 5/0078; H01S 5/4012
USPC ...................... 359/326–332; 385/14, 32, 129; 372/21–22
See application file for complete search history.

(56) References Cited

U.S. PATENT DOCUMENTS 3,586,872 A * 6/1971 Tien ........................ G02B 6/122
                                                        330/4.5
5,109,462 A * 4/1992 Watanabe ............... G02F 1/377
                                                        359/328
(Continued)

FOREIGN PATENT DOCUMENTS

| JP | 2009-152516 A | 7/2009 |
| JP | 2009-259914 A | 11/2009 |
| WO | 2010/137661 A1 | 12/2010 |

OTHER PUBLICATIONS

International Search Report of PCT/JP2012/077926 dated Nov. 27, 2012.

*Primary Examiner* — Daniel Petkovsek
(74) *Attorney, Agent, or Firm* — Sughrue Mion, PLLC

(57) ABSTRACT

A laser light source (100) includes a laser element (102) that emits a fundamental wave, a wavelength converting element (104) that performs wavelength conversion on the fundamental wave emitted from the laser element (102) and outputs the converted wave, and an optical waveguide (103) that guides the light output from the wavelength converting element (104). The optical waveguide (103) has a direction changing portion (113) that changes the travel direction of the guided light. The direction changing portion (113) has a function of transmitting the converted wave alone and of not transmitting the fundamental wave.

9 Claims, 9 Drawing Sheets

(51) Int. Cl.
*H01S 5/022* (2006.01)
*H01S 5/40* (2006.01)
*G02F 1/37* (2006.01)

(52) U.S. Cl.
CPC ............. *H01S5/4093* (2013.01); *G02F 1/37* (2013.01); *H01S 5/0092* (2013.01); *H01S 5/0228* (2013.01)

(56) References Cited

U.S. PATENT DOCUMENTS

| | | | | |
|---|---|---|---|---|
| 5,224,193 A | * | 6/1993 | Risk | 385/122 |
| 5,526,449 A | * | 6/1996 | Meade | B82Y 20/00 385/1 |
| 5,802,222 A | * | 9/1998 | Rasch et al. | 385/1 |
| 5,912,997 A | * | 6/1999 | Bischel et al. | 385/15 |
| 6,134,372 A | * | 10/2000 | Ichikawa | G02F 1/3511 359/332 |
| 6,208,455 B1 | * | 3/2001 | Ueno et al. | 359/332 |
| 6,498,675 B2 | * | 12/2002 | Ueno et al. | 359/332 |
| 6,646,784 B2 | * | 11/2003 | Leuthold | 359/332 |
| 6,972,894 B2 | * | 12/2005 | Bjarklev et al. | 359/332 |
| 7,778,291 B2 | * | 8/2010 | Koyata et al. | 372/21 |
| 8,280,211 B1 | * | 10/2012 | Baehr-Jones | G02F 1/3536 359/326 |
| 8,358,885 B2 | * | 1/2013 | Jeong | G02B 6/1228 385/32 |
| 8,704,447 B2 | * | 4/2014 | Ide et al. | 315/152 |
| 9,049,806 B2 | * | 6/2015 | Ide | G02B 6/12007 1/1 |
| 2008/0165810 A1 | | 7/2008 | Takeda | |
| 2009/0067036 A1 | * | 3/2009 | McCaughan et al. | 359/332 |
| 2009/0257462 A1 | | 10/2009 | Furukawa et al. | |
| 2011/0122481 A1 | * | 5/2011 | Ide et al. | 359/326 |
| 2012/0068609 A1 | | 3/2012 | Ide et al. | |

* cited by examiner

FIG. 6
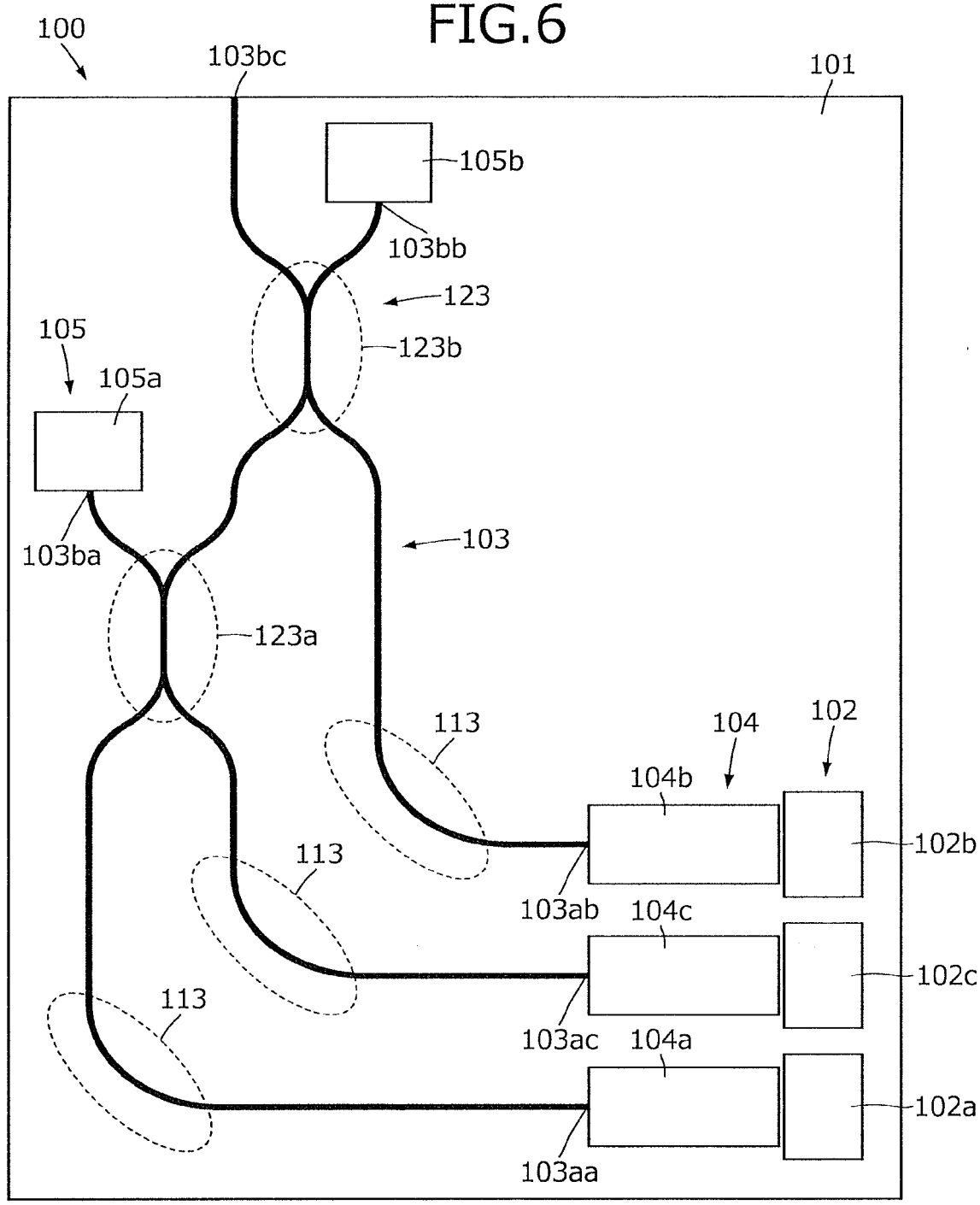
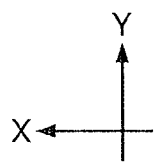

LASER LIGHT SOURCE

CROSS REFERENCE TO RELATED APPLICATIONS

This is a National Stage of International Application No. PCT/JP2012/077926 filed Oct. 29, 2012, claiming priority based on Japanese Patent Application No. 2011-243958 filed Nov. 7, 2011, the contents of all of which are incorporated herein by reference in their entirety.

TECHNICAL FIELD

The present invention relates to a laser light source having a laser element, an optical waveguide, and a wavelength converting element on a substrate.

BACKGROUND ART

A conventional laser source that has an optical waveguide formed on a substrate, such as a semiconductor substrate, as well as a laser element and an optical element arranged on the substrate, outputs laser light of a given wavelength (see, for example, Patent Document 1). A wavelength converting element that converts wavelengths in the optical waveguide by polarization inversion is used as an optical element. The laser element, for example, emits the fundamental wave (1060 nm) of the infrared region (IR) and via the wavelength converting element, emits green laser light of the second order harmonic (530 nm). Using this green laser light in addition to red and blue laser light, RGB light can be emitted.

Patent Document 1: Japanese Patent Application Laid-Open Publication No. 2009-259914

DISCLOSURE OF INVENTION

Problem to be Solved by the Invention

Nonetheless, with the laser light source above, since the fundamental wave is included in the light output from the wavelength converting element, the fundamental wave has to be removed using a filter. Consequently, since this filter has to be disposed, component costs increase and reductions in the size of the overall laser light source are difficult.

To solve the problems related to the conventional technology above, an object of the present invention is to provide a laser light source that enables size reductions and low-cost removal of the fundament without the need for an additional filter element.

Means for Solving Problem

To solve the problems above and achieve an object, a laser light source according to the present invention includes a laser element that emits a fundamental wave; a wavelength converting element that performs wavelength conversion with respect to the fundamental wave emitted by the laser element and outputs a resulting converted wave; and a waveguide that guides light output from the wavelength converting element. The waveguide has a direction changing portion that changes a travel direction of the guided light. The direction changing portion has a filter function of efficiently transmitting only the converted wave and attenuating the fundamental wave.

Without the addition of a high-performance filter element, the configuration above enables size reductions and low cost removal of the unnecessary fundamental wave emitted by the laser element, by a disposal of the direction changing portion in the waveguide, downstream from the wavelength conversion.

The direction changing portion is formed by a curved portion that is a portion of the waveguide curved to have a given curvature corresponding to the fundamental wave and the converted wave.

The configuration above enables the fundamental wave to be removed to a suitable level by a simple configuration in which the curved portion is disposed in the waveguide.

The direction changing portion is formed by a pair of straight portions that are disposed such that the waveguide has an angle of substantially 90 degrees, and a mirror disposed where the pair of straight portions are coupled and disposed at a given angle corresponding to the wavelength of the converted wave.

The configuration above enables the fundamental wave to be removed to a suitable level by a simple configuration in which the mirror is disposed in the waveguide.

The laser light source includes the laser element and the wavelength converting element in plural; and a directional coupler that is disposed in the waveguide and optically couples the wavelength converting elements.

The configuration above enables a laser light source to be obtained that converts the fundamental wave into plural wavelengths by the wavelength converting element, and that couples and outputs light by a directional coupler disposed in the waveguide.

The waveguide is formed on a substrate, and the direction changing portion of the waveguide is disposed on the substrate at plural positions.

Without the addition of a high-performance filter element, the configuration above enables simple fabrication and low cost removal of the fundamental wave that is emitted from the laser element, by forming on the substrate, the waveguide having the direction changing portion.

Effect of the Invention

The present invention, without the addition of a filter element, enables size reductions and low cost removal of the unnecessary fundamental wave that is emitted from a laser element.

BRIEF DESCRIPTION OF DRAWINGS

FIG. 6 is a plan view depicting a configuration of the laser light source according to a third embodiment;

BEST MODE(S) FOR CARRYING OUT THE INVENTION

Preferred embodiments of a laser light source according to the present invention will be described in detail with reference to the accompanying drawings.

First Embodiment (Laser Light Source Configuration)

Figure 1:
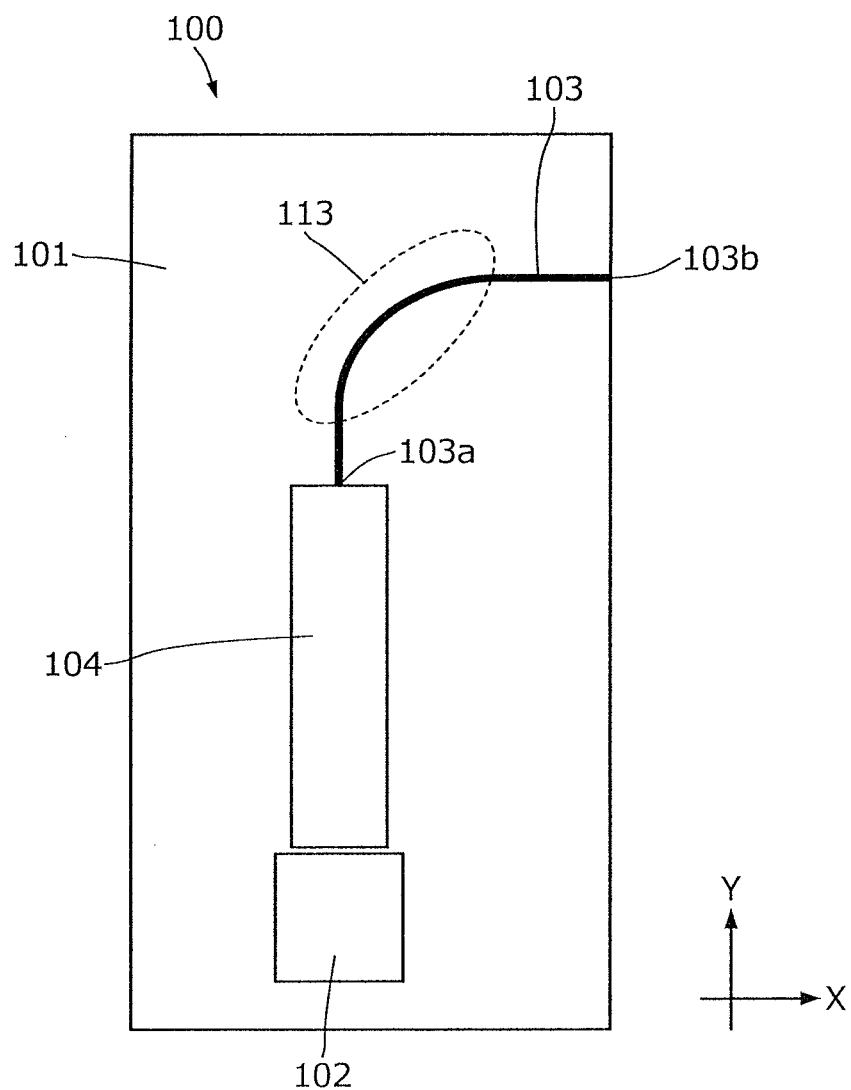
FIG. 1 is a plan view depicting a configuration of a laser light source according to a first embodiment.

FIG. 1 is a plan view depicting a configuration of a laser light source according to a first embodiment. A laser light source 100 has a substrate 101, an optical waveguide 103 formed on the substrate 101, and an optical element arranged (disposed) on the substrate 101. The optical element has a laser element 102 that emits IR light, and a wavelength converting element 104 that performs optical wavelength conversion. The wavelength converting element 104 is formed by an x-cut or y-cut periodically poled lithium niobate (PPLN) substrate causing polarization inversion in a horizontal direction with respect to the substrate.

The substrate 101 is made of, for example, a semiconductor material, such as silicon (Si), a metal, resin, and the like. The optical waveguide 103, which is made of a material such as silicon nitride (SiN), is disposed on a surface of the substrate 101. The optical waveguide 103 is formed by, for example, etching a ridge portion on the substrate. The optical waveguide 103 is not limited to a ridge type and can also be formed by proton exchange.

An end (incident end) of the wavelength converting element 104 is positioned at the emission point of the laser element 102. Light emitted from the laser element 102 can be optically coupled to the wavelength converting element 104, efficiently by direct coupling, and input to the wavelength converting element 104. Although not depicted, optical elements such as the laser element 102 and the wavelength converting element 104 are mounted by surface activated room temperature bonding in which electrodes of the optical elements are bonded to minute protrusions (micro bumps) formed on a surface of the electrodes of the substrate 101.

The laser element 102 emits, for example, the infrared region (IR) fundamental wave (1060 nm bandwidth); and via the wavelength converting element 104, emits a wave that has been converted into second order harmonic (530 nm bandwidth) green laser light (G wavelength). The light output by the wavelength converting element 104 is input to a first end (optical input side) 103a of the optical waveguide 103. As a result, the light output by the wavelength converting element 104 can be optically coupled to the optical waveguide 103, efficiently by direct coupling, and input to the optical waveguide 103. In addition to the converted wave wavelength component, the wavelength converting element 104 includes the fundamental wave component emitted by the laser element 102.

A quasi phase matching (QPM) element can be used as the wavelength converting element 104. In particular, in the case of a QPM-type second harmonic generation (SHG) element designed to generate the second harmonic, a SHG laser light source can be configured. Further, since the laser element 102 and the wavelength converting element 104 can be directly coupled as can the wavelength converting element 104 and the optical waveguide 103, lower cost and size reductions can be achieved.

The optical waveguide 103 internally confines and guides light that has been input from the first end 103a and outputs the light from a second end 103b. A direction changing portion 113 that changes the travel direction of the guided light is disposed at a position along the optical waveguide 103.

The direction changing portion 113, in the first embodiment, causes the second end 103b to be positioned on the same plane as the first end 103a and in a direction curving 90 degrees with respect to the first end 103a. In addition to being a curved portion where the optical waveguide 103 itself is curved, the direction changing portion 113 can be formed by disposing a mirror at a corner of a linear waveguide.

As depicted in FIG. 1, when the direction changing portion 113 is a curved portion where the optical waveguide 103 itself is curved, the curved portion is disposed between straight portions on each end. Since the curved portion is set to have the smallest curve possible and to minimize propagation loss of the converted wave, the curved portion has a function of blocking the fundamental wave, which is on the long-wavelength side, by a coupling of the fundamental wave with the radiation mode and the cladding mode. Optical output Pout of the optical waveguide 103 when a curved portion is provided as the direction changing portion 113 may be expressed as:

$$Pout = Pin \cdot \exp(-\Sigma \alpha i \cdot li)$$

Where, $\alpha i$ is an apparent absorption coefficient of the optical waveguide 103 having an i-th curvature; is a function of the radius of curvature R; and contributes to the wavelength characteristic of optical loss. In other words, according to the wavelengths of the fundamental wave that is desired to be removed and the wavelength of the converted wave that is desired to be transmitted, the radius of curvature R is set. Further, li is the length of the optical waveguide 103 having the i-th curvature; and contributes to the amount of optical loss. In FIG. 1, although the number of curved portions i is just 1, the number of curved portions i may be set to be plural, whereby the blocking effect with respect to the fundamental wave can be increased.

Figure 2:
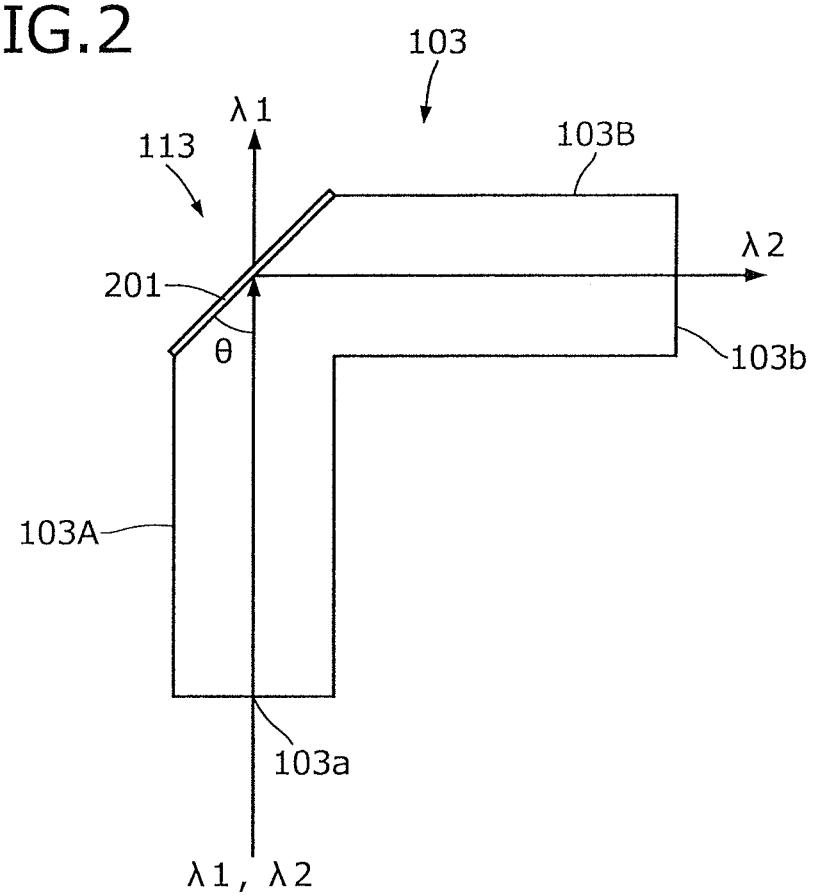
FIG. 2 is a diagram depicting an example of a configuration using, as a direction changing portion, a mirror that is wavelength dependent.

FIG. 2 is a diagram depicting an example of a configuration using, as the direction changing portion, a mirror that is wavelength dependent. The optical waveguide 103 is formed by a straight portion 103A on the first end 103a side and a straight portion 103B on the second end 103b side; and this pair of straight portions 103A, 103B forms a 90-degree angle with one another. Consequently, a 90-degree bend portion can be formed. Further, at a corner portion where the straight portions 103A and 103B are coupled, a total internal reflection mirror 201 is disposed that has a given angle θ and uses an anisotropic medium.

Via the mirror 201, by an adjustment of the given angle θ, the light of the fundamental wave λ1 (1064 nm bandwidth) guided by the straight portion 103A to the mirror is coupled with the radiation mode and the cladding mode of the waveguide, whereby the propagation mode of the core is attenuated and, the light of the converted wave λ2 (530 nm bandwidth) is reflected with high efficiency and subsequent to the mirror, is efficiently coupled with the fundamental guided mode of the converted wave λ2.

Figure 3:
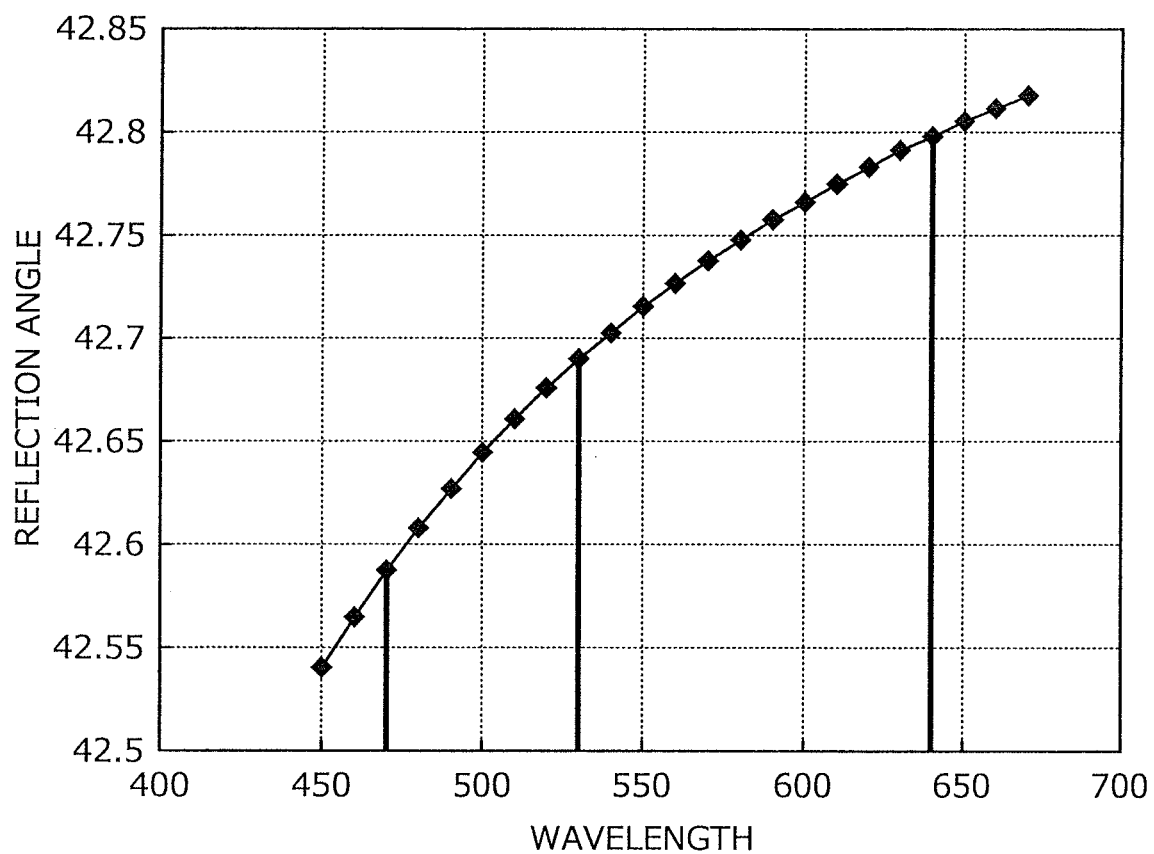
FIG. 3 is a diagram depicting the relationship between wavelength and reflectance of the mirror.

FIG. 3 is a diagram depicting the relationship between wavelength and reflectance of the mirror. Here, wavelength dependency of the reflected light from the mirror 201 will be discussed. Reflection angles calculated for RGB wavelengths for the anisotropy of LN, using reflection coefficients ne, no of LN doped with 5 mole percent of MgO are depicted in FIG. 3. According to the calculation results, for the B wavelength (470 nm), the reflection angle is 42.59 degrees; for the G wavelength (530 m), the reflection angle is 42.69 degrees; and for the R wavelength (640 nm), the reflection angle is 42.80 degrees.

Next, adjustment of the reflective mirror will be described. According to the calculation results above, for example, at the wavelength of 470 nm, the reflection angle is above 42.6 degrees. Therefore, the angle formed by the incident wave and the reflected wave is 45+42.6=87.6 degrees and less than 90 degrees. To form a 90-degree bend, the angle of the mirror 201 has to be adjusted.

Figure 4:
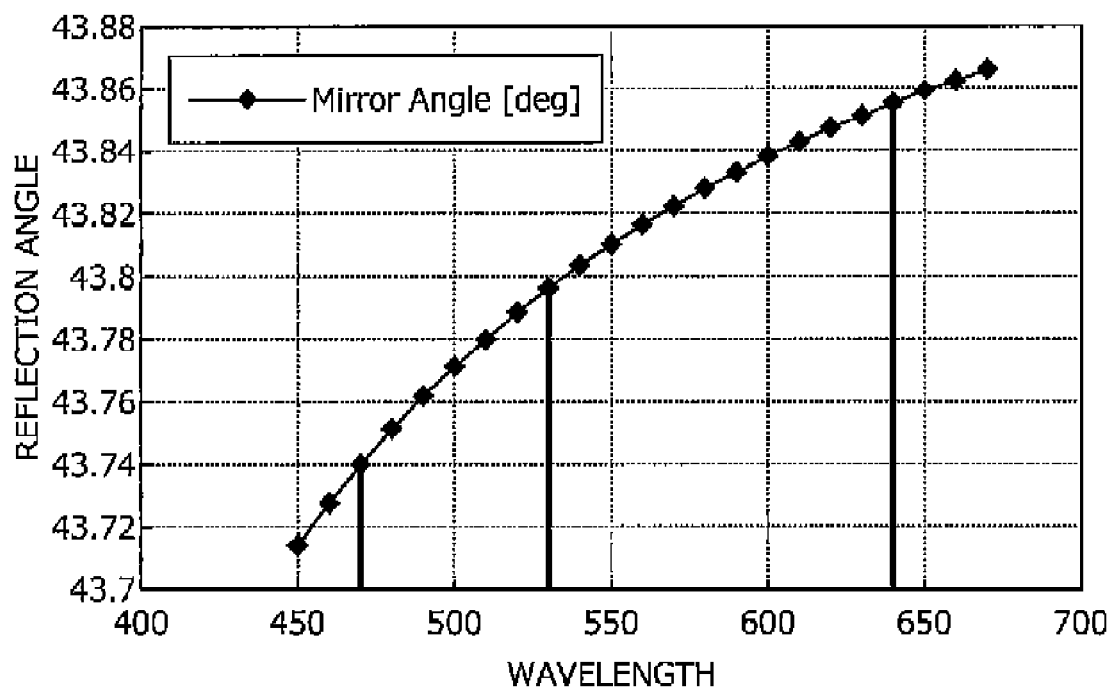
FIG. 4 is a diagram depicting an example of the relationship between wavelength and mirror angle.

FIG. 4 is a diagram depicting an example of the relationship between wavelength and mirror angle. In the example, the mirror angle for the B wavelength (470 nm) is 43.74 degrees; the mirror angle for the G wavelength (530 nm) is 43.80 degrees; and the mirror angle for the R wavelength (640 nm) is 43.86 degrees. Therefore, when the incident wave can be approximated by a planar wave, a 90-degree bend becomes possible by determining the angle of the mirror 201 as described above. Here, the mirror angle optimal for a given converted wavelength differs from the optimal angle determined from the refractive index at the fundamental wave and therefore, in the waveguide subsequent to the mirror, the fundamental wave portion is coupled with the radiation mode and the cladding mode, and can be attenuated.

Further, by disposing the total internal reflection mirror 201 in the ridge-type optical waveguide 103, to be inclined at an angle corresponding to the required wavelength, light emitted from a semiconductor laser can make a 90-degree turn with little loss. Further, by disposing the optical waveguide 103 equipped with the 90-degree bend mirror 201, the size of the laser light source 100 overall can be reduced.

For the direction changing portion 113, configuration may be such that a half-mirror having a wavelength film with a property of transmitting the fundamental wave and reflecting the converted wave is used as the mirror 201 in the description above. With this mirror 201 as well, the unnecessary fundamental wave can be blocked without requiring additional installation space.

According to the first embodiment, by disposing the direction changing portion in the optical waveguide, the unnecessary fundamental wave component that is emitted by the laser light source and is not removed by the wavelength converting element is blocked and thus, output thereof from the second end of the optical waveguide to an external destination can be prevented. As a result, the desired wavelength alone can be output to an external destination, without newly installing an additional filter element. Further, by disposing the direction changing portion in the optical waveguide, the size of the laser light source can be reduced, particularly in a dimension of height, depicted as the vertical (Y axis) direction in FIG. 1.

Second Embodiment

Figure 5:
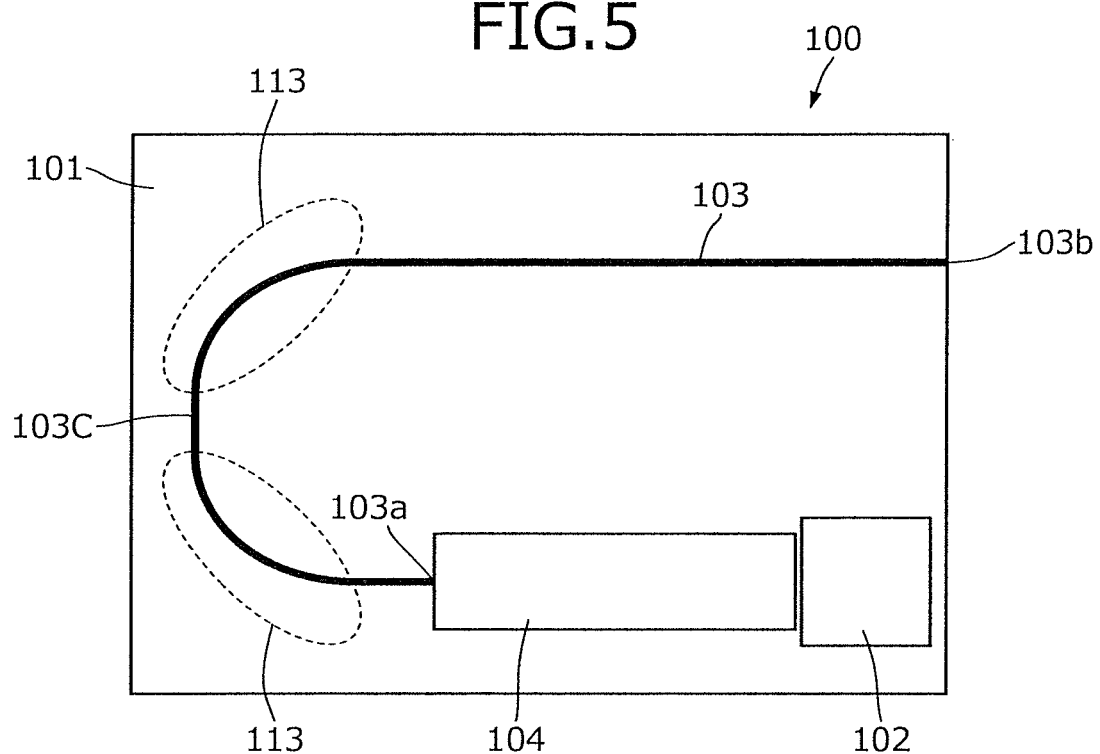
FIG. 5 is a plan view depicting a configuration of the laser light source according to a second embodiment.

FIG. 5 is a plan view depicting a configuration of the laser light source according to a second embodiment. The second embodiment is a modification example of the first embodiment, where the optical waveguide 103 has the direction changing portion 113, 113 disposed at two positions and has a 180-degree switchback configuration.

In the optical waveguide 103, the first end 103a is directly coupled with the light output from the wavelength converting element 104, and a converted wave resulting after wavelength conversion is output from the second end 103b to an external destination. A straight portion 103C of a given length is disposed between the direction changing portions 113, 113 disposed at two positions.

In this manner, according to the second embodiment, by disposing the direction changing portion at two positions, the blocking effect with respect to the fundamental wave can be increased. Furthermore, by disposing the direction changing portions in plural, light can be output to an external destination, in an arbitrary direction in units of 90-degrees corresponding to the number of direction changing portions disposed.

Third Embodiment

FIG. 6 is a plan view depicting a configuration of the laser light source according to a third embodiment. In the third embodiment, the laser elements 102 (102a to 102c) that emit IR light for red (R), green (G), and blue (B); the wavelength converting elements 104 (104a to 104c) that respectively perform wavelength conversion of the laser light (the fundamental wave) from the laser element 102 into RGB light; and an optical detector (PD) 105 are disposed.

In the optical waveguide 103 on the substrate 101, the first ends 103a (103aa to 103ac) are positioned at the optical output ends of the wavelength converting elements 104 (104a to 104c), and are directly connected thereto. The second end 103ba is positioned at the optical input end of the optical detector 105a; the second end 103bb is positioned at the optical input end of the optical detector 105b; and the second end 103bc outputs light to an external destination.

The optical waveguide 103 has, at intermediate positions, the direction changing portions 113 and directional couplers 123 (123a, 123b). The direction changing portions 113 remove the fundamental wave from the R, G, and B light via the wavelength converting elements 104a to 104c. The direction changing portions 113, as described in the first embodiment, can be configured to be a curved portion of the optical waveguide 103 and can be configured by disposing the total internal reflection mirror 201.

Further, the directional couplers 123a, 123b have respective coupling lengths. At the directional coupler 123a, R and B light are coupled and output; at the directional coupler 123b, the RB light coupled by the directional coupler 123a is coupled with G light and output.

Thus, the optical detector 105a detects the level of the RB light. Further, the optical detector 105b detects the level of the RGB light. In the third embodiment, the laser elements 102a to 102c are respectively configured to emit IR light and to output RGB converted waves via the wavelength converting elements 104a to 104c. However, configuration is not limited hereto. For example, configuration may be such that the laser element 102b for green alone is an IR laser element, while the other the laser elements 102a, 102c for red and blue are direct emitting laser elements.

Thus, in the configuration of the third embodiment in which multi-wavelength light is output, by disposing the direction changing portions 113 in the optical waveguide 103 portions for the RGB light, the fundamental wave emitted by the laser elements 102 (102a to 102c) is blocked and the desired RGB light alone can be output. Further, as depicted in FIG. 6, the direction changing portions 113 disposed at three positions with respect to the optical waveguide 103 are respectively oriented in the same direction and have a 90-degree curve in which a dimension of length parallel to the horizontal (X axis) depicted in FIG. 6 turns in direction parallel to the vertical (Y axis). Consequently, the length in the horizontal direction can be reduced.

According to the third embodiment, similar to the first embodiment, the unnecessary fundamental wave component that is emitted by the laser light source and is not removed by the wavelength converting elements is blocked and thus, output thereof from the second end of the optical waveguide can be prevented. As a result, the desired wavelength alone can be output to an external destination, without newly installing an additional filter element. Further, by disposing the direction changing portions in the optical waveguide, space on the substrate can be effectively utilized, enabling the size of the laser light source overall to be reduced.

Fourth Embodiment

Figure 7:
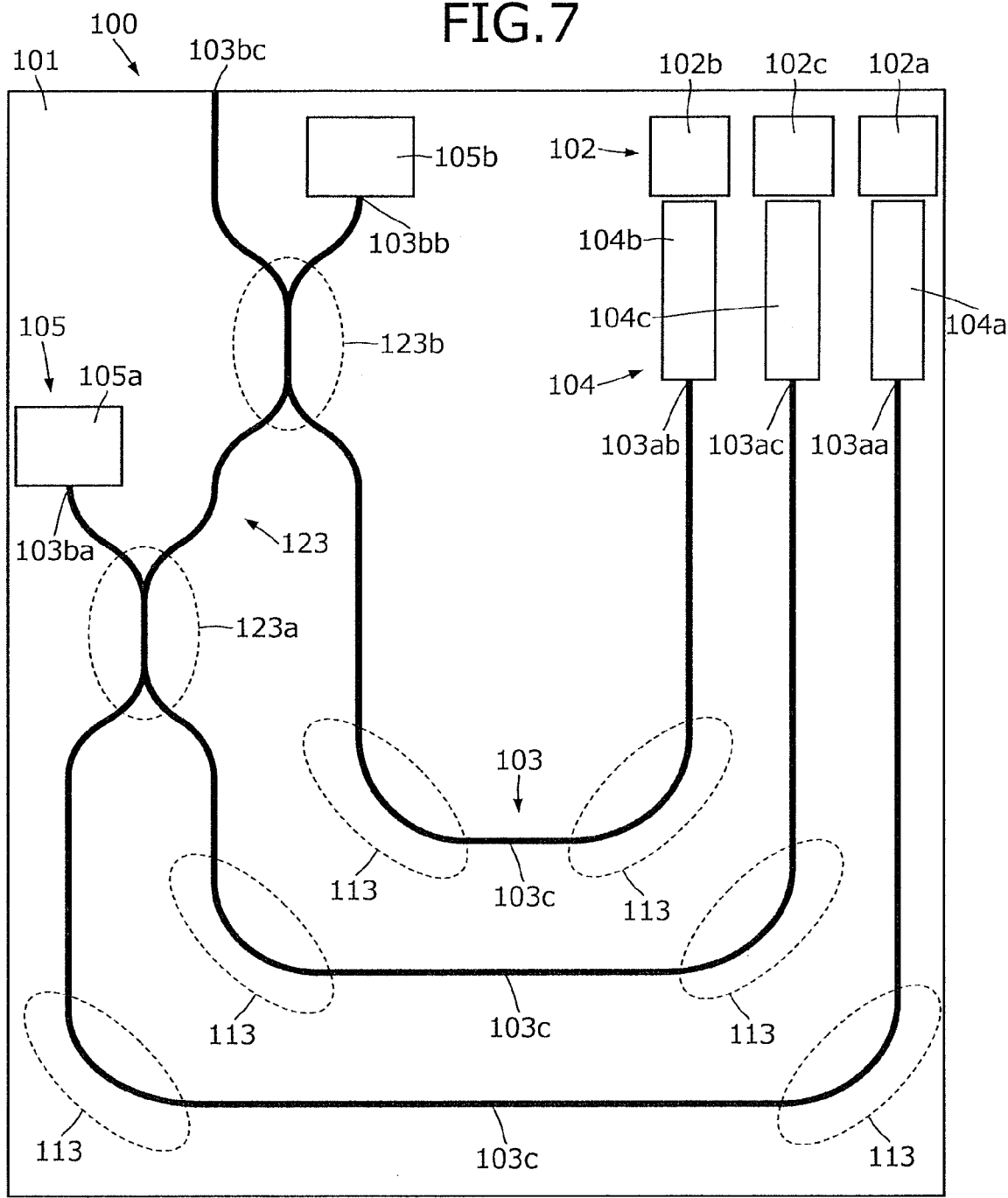
FIG. 7 is a plan view depicting the laser light source according to a fourth embodiment.

FIG. 7 is a plan view depicting the laser light source according to a fourth embodiment. Similar to the third embodiment, the laser elements 102 (102a to 102c) that emit IR light for red, green, and blue; the wavelength converting elements 104 (104a to 104c) that respectively perform wavelength conversion of the laser light (the fundamental wave) from the laser element 102 into RGB light; and an optical detector (PD) 105 are disposed. Further, in the optical waveguide 103, the direction changing portions 113 are disposed at two positions.

The straight portion 103C of a given length is disposed between the direction changing portions 113, 113 disposed at two positions. By disposing the direction changing portions 113 in plural, light can be output to an external destination, in an arbitrary direction in units of 90-degrees corresponding to the number of direction changing portions disposed. In the example depicted in FIG. 7, the direction changing portions 113 disposed at two positions with respect to the optical waveguide 103 are curved 90-degrees toward the same direction, forming a switchback of 180 degrees. Thus, on the substrate 101, the second ends 103ba to 103bc of the optical waveguide 103 can be disposed on the same side as the first ends 103aa to 103ac.

According to the fourth embodiment, by disposing the direction changing portions in plural, the blocking effect with respect to the fundamental wave can be increased. Furthermore, by disposing the direction changing portions in plural in the optical waveguide, space on the substrate can be effectively utilized, enabling the size of the laser light source overall to be reduced.

The optical waveguide of each of the embodiments described above can be precisely formed by etching, etc. on a substrate and in particular, the first end and the second end can be precisely positioned. Therefore, by merely positioning the optical input end of the optical element (the wavelength converting element and the detector in each of the embodiments above) with respect to the first end and the second end of the optical waveguide and mounting the optical element, optical coupling of the optical waveguide and optical element can be performed easily and with low loss.

(1. Optimization of Bend Structure)

Next, an example of optimization of the structure of the curved portion (bend) of the curved waveguide when lithium niobate is used as the waveguide material will be described.

1) Optimization of Length of 90-Degree Bend Portion

Figure 8:
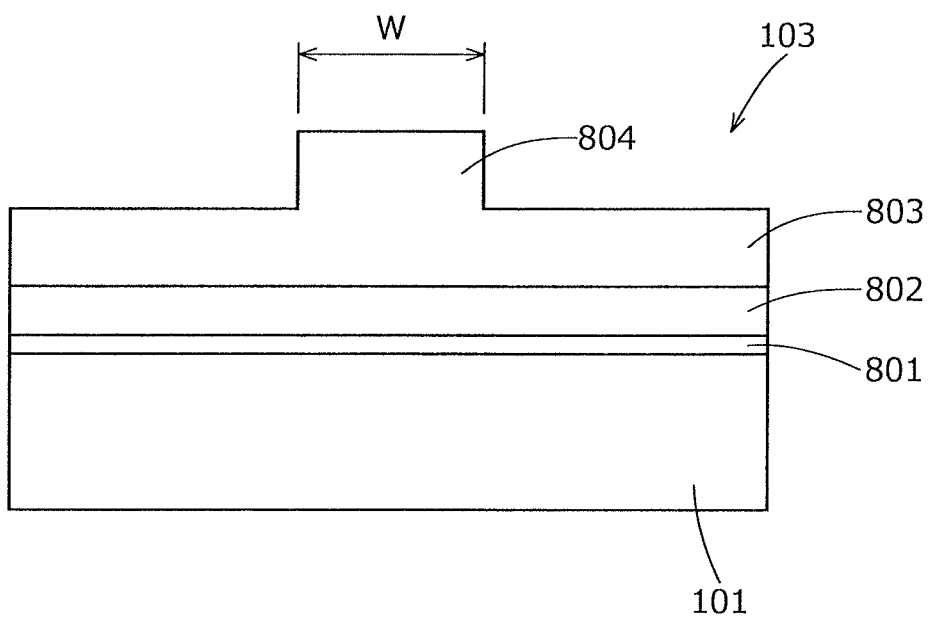
FIG. 8 is a cross sectional view of the structure of a waveguide.

FIG. 8 is a cross sectional view of the structure of the waveguide. The substrate 101 is a lithium niobate (LN) substrate and the waveguide 103 is disposed on the substrate 101. The waveguide 103 is disposed having an ITO layer 801 of a 0.27 μm thickness. On the ITO layer 801, an SiO$_2$ layer 802 having a thickness of 1.0 μm is disposed. On the SiO$_2$ layer 802, a LN layer 803 doped with 5 mole percent of MgO and having a thickness of 1.88 μm is disposed. On the LN layer 803, a ridge layer 804 having a thickness of 1.82 μm and a width of 4.7 μm is disposed. The ridge layer 804 has a refractive index of 2.227 with respect to a wavelength of 532 nm; and a refractive index of 2.146 with respect to a wavelength of 1064 nm. The SiO$_2$ layer 802 of the waveguide 103 in the configuration above functions as the clad layer. The ITO layer 801 is a shared electrode used when creating a periodic polarization inversion structure of the LN portion.

Consideration is given to forming the waveguide 103 having the cross sectional structure depicted in FIG. 8 as a 90-degree bend. Here, a length L is obtained by simulation when the wavelength (here, the wavelength of the SH wave=532 nm, and the wavelength of the fundamental wave=1064 nm are assumed) of a given SH wave is 532 nm and loss is minimized.

Figure 9:
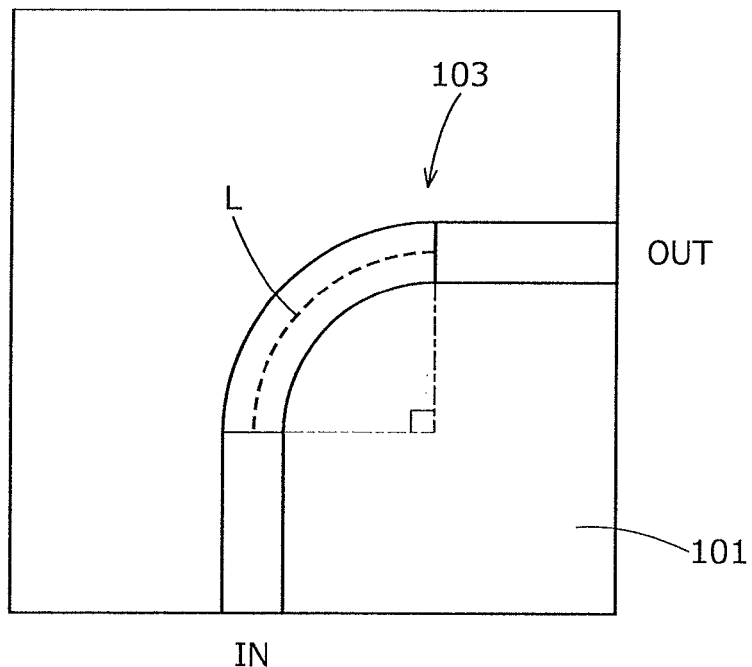
FIG. 9 is a plan view of a bend portion of the waveguide.

FIG. 9 is a plan view of a bend portion of the waveguide. The length L is the distance measured along a center position of the waveguide 103 and the curvature is assumed to be constant. In the simulation, FIMMWAVE of Photon Design Ltd. was used. As one optimal solution where both ends OUT/IN of the waveguide 103 approach 100%, L=1248 μm was obtained. The power ratio of OUT/IN for this length was 97.3%. On the other hand, the power ratio of OUT/IN when light having a wavelength of 1064 nm passed through the same waveguide 103 was 71.5%. By disposing two stages of the same section, it is projected that the fundamental wave can be attenuated as much as 51.1%.

2) Optimization of Length of Sections Curved every 10 Degrees

Figure 10:
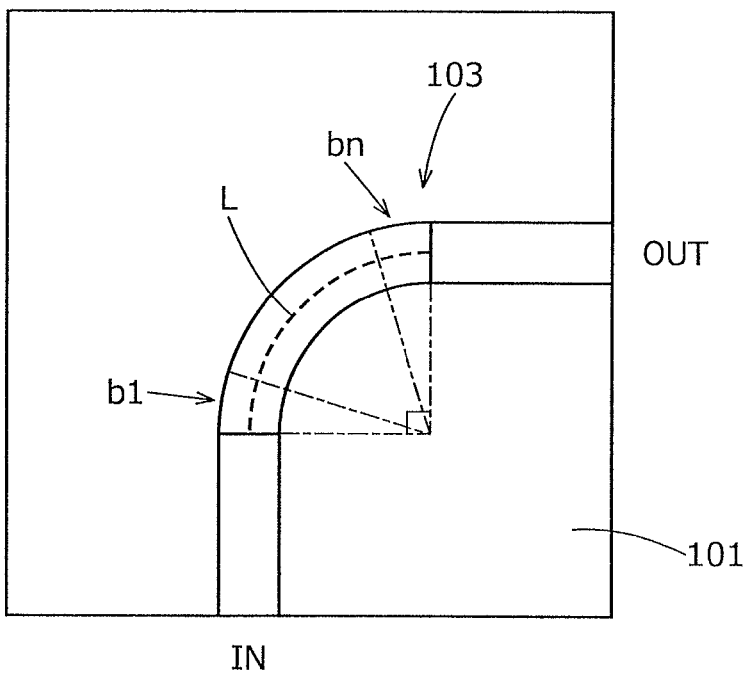
FIG. 10 is a plan view depicting a case where the bend portion of the waveguide is divided into subsections.

FIG. 10 is a plan view depicting a case where the bend portion of the waveguide is divided into subsections. In the figure, although the radius of curvature appears constant, since the length of each subsection b1 to bn differs after optimization calculations, when the subsections b1 to bn are subject to a condition that the bend angle thereof be constant, the radius of curvature differs for each of the subsections b1 to bn.

With the bend angle of the bend portion being constant, a number of sections were created and simulation optimizing the lengths of the subsections b1 to bn when the input/output ratio for a given wavelength is maximized was performed. As an example, lengths (μm) resulting for a case where nine subsections (b1 to b9) were created and each subsection b1 to b9 had a bend angle of 10 degrees. Here, since the lengths of the subsections b1 to b9 differ, in order to maintain the same bend angle, the radius of curvature differs among the subsections b1 to b9.

TABLE 1

| SUBSECTION | LENGTH [μm] |
| --- | --- |
| b1 | 187.0 |
| b2 | 14.8 |
| b3 | 15.1 |
| b4 | 163.6 |
| b5 | 12.3 |
| b6 | 163.6 |
| b7 | 15.1 |
| b8 | 14.8 |
| b9 | 187.0 |

Table 1 depicts an optimization calculation example. In this example, the OUT/IN ratio for 532 nm is 8.5%; and is 75.2% for 1064 nm. Thus, the 90-degree bend design described in 1) above enables reduction of loss for a SH wave of 532 nm. Further, when the configuration includes two stages of this section, it is thought that attenuation on the order of 56.6% is possible for 1064 nm.

(2. Consideration of Filter Effect)

Consideration is given to applying an attenuation filter for the fundamental wave of an SHG laser, to the structure described in 1) above. With an SHG laser for practical use, when quasi phase matching arises with the PPLN, light that leaks without being converted into an SH wave can be considered to be 10% or less and therefore, for example, in the example in 1) above, Total input to PPLN during quasi phase matching 150 mW
Efficiency of conversion to SH wave 90%→135 mW
Residual fundamental wave component 10%→15 mW
Output after transmission through bend portion:
  SH wave 135 mW×97.3%=131.4 mW
  fundamental wave 15 mW×71.5%=10.725 mW and therefore, by merely mounting a simple IR cut filter downstream, most of the IR can be attenuated.

In the description above, an example of configuring a fundamental wave cut filter by an extremely simple bend structure has been described. Furthermore, by modifying the structure, a sufficient fundamental wave cut filter can be formed by the waveguide alone. For example, by providing multiple stages of a curved portion, the attenuation of the fundamental wave can be increased by manyfold.

By disposing the curved portion, the pitch of the waveguide can be changed and narrowed by modifying the waveguide wiring at the location of the curved portion. Furthermore, since secondary effects such as efficient use of the wiring area are obtained, these effects also contributed to reductions in size. The formed waveguide may be formed such that on a Si platform substrate, a ridge waveguide is formed as a face-down structure on the Si platform side, through a gap or the clad layer.

As described, the laser light source according to the present invention is useful with laser light sources that emit light through optical elements such as a laser element, a waveguide, a wavelength converting element, etc.; and is particularly suitable for a light source in an optical system.

EXPLANATIONS OF LETTERS OR NUMERALS 100 laser light source
101 substrate
102 (102a to 102c) laser element
103 optical waveguide
104 (104a to 104c) wavelength converting element
105 (105a, 105b) optical detector
113 direction changing portion
123a, 123b directional coupler

The invention claimed is:

1. A laser light source comprising:
a laser element that emits a fundamental wave;
a wavelength converting element that performs wavelength conversion with respect to the fundamental wave emitted by the laser element and outputs a light comprising a resulting converted wave and the fundamental wave; and
a waveguide that guides the light that is output from the wavelength converting element,
wherein the waveguide along a length thereof is unbranched and has a direction changing portion that changes a travel direction of the guided light, and
the direction changing portion having a shape that provides a filter function of transmitting the converted wave alone and of not transmitting the fundamental wave.

2. The laser light source according to claim 1, wherein the direction changing portion changes an output direction of the light by bending the waveguide substantially ninety degrees at two positions forming a switchback of 180 degrees.

3. The laser light source according to claim 2, wherein the direction changing portion comprises a first curved portion at a first position and a second curved portion at a second position with a straight portion of a predetermined length therebetween.

4. The laser light source according to claim 1, wherein said filter function is effected by blocking the fundamental wave, which is on the long-wavelength side, by a coupling of the fundamental wave with a radiation mode and a cladding mode.

5. The laser light source according to claim 1, wherein the waveguide comprises in order of light transmission a first straight portion, a direction changing portion and a second straight portion, the direction changing portion being a curved portion having a radius of curvature set according to the wavelength of the fundamental wave to remove the fundamental wave and set according to the wavelength of the converted wave to transmit the converted wave.

6. The laser light source according to claim 5, wherein an optical output Pout of the optical waveguide is expressed as Pout=Pin·exp(−Σαi·li), where, αi is an apparent absorption coefficient of the optical waveguide having an i-th curvature, is a function of the radius of curvature of the curved portion; and contributes to the wavelength characteristic of optical loss.

7. The laser light source according to claim 1, wherein the optical waveguide comprises, in order of light transmission, a first straight portion having a first end disposed on a plane, a direction changing portion, and a second straight portion having a second end disposed on said plane, the direction changing portion being a curved portion curving 90 degrees with respect to said first end.

8. The laser light source according to claim 1, wherein the optical waveguide is one of a ridge type and a proton exchange type waveguide.

9. A laser light source comprising:
a laser element that emits a fundamental wave;
a wavelength converting element that performs wavelength conversion with respect to the fundamental wave emitted by the laser element and outputs a light comprising a resulting converted wave and the fundamental wave; and
a waveguide that guides the light that is output from the wavelength converting element,
wherein the waveguide has a curved direction changing portion that changes a travel direction of the guided light, and
wherein the curved direction changing portion having a shape that provides a filter function of transmitting the converted wave alone and of not transmitting fundamental wave, and
wherein the curved direction changing portion is divided into subsections along a direction in which the light is guided, the subsections having respective lengths and radii of curvature set such that an input-output ratio of the light is maximized with a bend angle of the subsections being constant.

* * * * *